United States Patent [19]

Tsuchida et al.

[11] Patent Number: 6,097,660
[45] Date of Patent: *Aug. 1, 2000

[54] SEMICONDUCTOR MEMORY DEVICE

[75] Inventors: Kenji Tsuchida, Kawasaki; Shinichiro Shiratake; Tsuneo Inaba, both of Yokohama, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/053,511

[22] Filed: Apr. 2, 1998

[30] Foreign Application Priority Data

Apr. 4, 1997 [JP] Japan .................................. 9-086788

[51] Int. Cl.⁷ ..................................................... G11C 8/00
[52] U.S. Cl. .......................... 365/230.03; 365/51; 365/63
[58] Field of Search .......................... 365/52, 63, 230.03, 365/51

[56] References Cited

U.S. PATENT DOCUMENTS

| | | | |
|---|---|---|---|
| 5,321,657 | 6/1994 | Arimoto et al. | 365/230.03 |
| 5,384,745 | 1/1995 | Konishi et al. | 365/230.03 |
| 5,563,820 | 10/1996 | Wada et al. | 365/63 |
| 5,621,690 | 4/1997 | Jungroth et al. | 365/230.03 |
| 5,644,527 | 7/1997 | Kubota | 365/63 |
| 5,648,928 | 7/1997 | Yoon et al. | 365/63 |
| 5,894,448 | 4/1999 | Amano et al. | 365/230.03 |

OTHER PUBLICATIONS

Jei–Hwan Yoo, Chang–Hyun Kim ; IEEE J.S.S.C. vol. 31, No. 11; A 32–Bank 1 GB Self–Strobing Synchronous Drams with 1 GBYTE/S Bandwidth; Nov. 1996; pp. 1635–1644.

*Primary Examiner*—David Nelms
*Assistant Examiner*—Gene N. Auduong
*Attorney, Agent, or Firm*—Banner & Witcoff, Ltd.

[57] ABSTRACT

A semiconductor memory device comprises a plurality of memory banks each having a plurality of memory cell arrays and a plurality of sense amplifiers such that the memory cell arrays and the sense amplifiers are alternately disposed in a first direction, the memory banks being disposed in a second direction perpendicular to the first direction, a plurality of row decoders respectively provided in the first direction for the plurality of memory banks, a column decoder provided in the second direction with respect to the plurality of memory banks, a plurality of first data lines respectively provided in the second direction for the plurality of memory banks, and connected with the plurality of sense amplifiers in accordance with a signal outputted from the column decoder, a plurality of second data lines provided in the second direction, penetrating through the plurality of memory banks, and shared by the plurality of first data lines disposed for the plurality of memory banks, and a plurality of switching elements each having a first end connected to one of the plurality of first data lines and a second end connected to one of the plurality of second data lines, and controlled by a bank activation signal of a memory bank corresponding to the first data line connected to the first ends.

34 Claims, 12 Drawing Sheets

SEMICONDUCTOR MEMORY DEVICE

BACKGROUND OF THE INVENTION

The present invention relates to a semiconductor memory device in which DRAM (Dynamic Random Access Memory) cells are integrated and arranged and particularly to a layout system of a DRAM core circuit.

Memory cells constituting a DRAM are constructed in a relatively simple structure, and therefore, a DRAM is the most highly integrated device among MOS-type semiconductor memory devices. At present, mass-production of 64M-bit DRAMs has been started and prototypes of 1G-bit DRAMs have been announced.

An integration of DRAMs has proceeded more and more highly, and the processing speed of DRAMs has been improved. However, since the processing speed of DRAMs cannot match up to surprising improvements of the processing speed of CPUs, total performance of a computer system depends on the processing speed of DRAMs, in recent years.

In order to solve the above-mentioned problem, a high-speed cache memory is provided between a CPU and a DRAM. The total performance of a computer system is improved by making a CPU access data through a high-speed cache memory.

In this kind of computer system, a DRAM must fill a cache line of a cache memory at a high speed. It is therefore more significant for a DRAM to make serial access than to make random access. As a result, an operation mode for burst-transferring data at a speed as high as possible has become the main trend in the field of general purpose DRAMs. For example, at present, DRAMs of an EDO (Extended Data Out) mode are more often used than DRAMs of a FPM (Fast Page Mode). In the future, the main trends of main memories will surely be a synchronous DRAM (SDRAM) or a Rambus DRAM (RDRAM) which can make access at a high speed in synchronization with an external clock.

Meanwhile, there is a case that a multi-CPU having a plurality of CPUs is used to further raise the performance of a computer system. This multi-CPU system is presently adopted only in a high-performance server machine. However, the multi-CPU system is expected to be adopted in a consumer multimedia system used mainly for real-time reproduction of movies. In this multi-CPU system, random access is as significant as serial access. This means that a memory element having a very high data throughput is required.

In response to this requirement, consideration has been taken into a system in which a large capacity DRAM is divided into a plurality of blocks (or banks) and the blocks are operated independently of each other. The system is generally called an interleave system. With use of the interleave system, it is possible to improve the throughput of data during random access so that validity of a data bus between a CPU and a DRAM can be raised and performance of the system can be improved. For example, Jei-Hwan Yoo et al. reported a 1G bit DRAM having 32 banks (in "A 32-bank 1 Gb Self-Strobing Synchronous DRAM with 1 Gbyte/s Bandwidth", IEEE Journal of Solid-State Circuit, Vol. 31, No. 11, Nov., 1996, pp 1635–1644).

The following explains a bank structure method called a merged bank architecture reported by Jei-Hwan Yoo et al.

FIG. 1A shows a conventional DRAM. In the following, the same components are denoted by the same reference symbols and explanation thereof will be omitted herefrom.

Each of memory banks BANK0L to BANK7L has a memory capacity of 16M bits. A row decoder X-D and a column decoder Y-DEC are provided for each of the memory banks BANK0L to BANK7L.

In the conventional method described above, memory banks are operated independently of each other, so that a row decoder X-D and a column decoder Y-DEC are required for every bank. Therefore, there is a problem that the chip size is increased if a multi-bank system is adopted.

In order to avoid an increase of the chip size, adjacent banks may use a data bus and a row decoder in common. In this case, however, adjacent banks cannot be operated independently of each other and the number of valid banks is decreased. As a result, the data throughput of a DRAM is lowered and the performance of a computer system is lowered.

FIG. 1B shows a bank structure method called a merged bank architecture considered by Jei-Hwan Yoo et al.

In this structure method, a column decoder Y-DEC is provided at a lower portion of a chip and is shared by memory banks BANK0L to BANK7L.

Also, a data line GIO is shared by different banks. The data line GIO is provided so as to penetrate memory cell arrays on memory cell arrays.

In this method, a column decoder Y-DEC and a data line GIO are thus shared by a plurality of memory banks, and the chip size can therefore be reduced to 85.5% compared with a conventional method shown in FIG. 1A.

FIG. 2A shows a specific circuit example of a merged bank architecture shown in FIG. 1B.

In each of the memory banks BANK0L to BANK7L, memory cell arrays each having a capacity of 256 Kb are arranged in an array of (4 longitudinal pieces)×(16 lateral pieces). Sense amplifiers S/A are provided at upper and lower portions of each cell array. The sense amplifiers S/A are connected to first data lines LIO extending in the lateral direction.

Second data lines GIO extend in the longitudinal direction, crossing memory banks BANK0L to BANK7L. The first lines LIO and second data lines GIO are connected through multiplexers R/W MUX.

Local column decoders LCD are respectively provided for memory banks. FIG. 2B shows a circuit example of a local column decoder LCD. A global column select line GCSL extends in the longitudinal direction, crossing memory banks BANK0L to BANK7L, and an end of the line is connected to an output terminal of a column decoder Y-DEC. A signal BANKCAi is used for activating an i-th memory BANKiL, and a signal BANKCAiB is an inverted signal of the signal BANKCAi. A local column select line LCSL extends in the longitudinal direction in a memory bank. In a local column decoder LCD of a bank activated, when the signal BNKCAi rises to a high level and the signal BANKCAiB goes to a low level, a transistor T1 is turned on and a transistor T2 is turned off, so that a global column select line is electrically connected with the local column select line of the bank.

Data from a memory cell is transferred through a first data line LIO to a second data line GIO when a signal on a local column select line rises to a high level.

The bank structure method shown in FIG. 2A has a following problem.

In this circuit, a column decoders Y-DEC is shared by different banks and a second data line GIO is also shared by different banks in order to reduce the chip size. Meanwhile, in order to operate banks independently of each other, a local column decoder LCD is required for every bank.

Thus, regardless of column decoders Y-DEC are shared, every bank requires a local column decoder LCD so that the chip size cannot be greatly reduced.

FIG. 3 shows a circuit example without use of a local column decoder LCD. FIG. 3 shows a memory cell array 1, a sense amplifier 2, and a selection switch 3. Two transfer gates 4 and 5 connected in series and two transfer gates 6 and 7 connected in series are respectively provided between a bit line and a first data line LIO or bLIO. The gates of the transfer gates 4 and 6 are supplied with a bank activation signal CAi and the gates of the transfer gates 5 and 7 are supplied with an output signal CSL from a column decoder Y-DEC.

However, in the circuit shown in FIG. 3, the number of transfer gates is greater than in the circuit shown in FIGS. 2A and 2B. Therefore, the operation speed is lowered as the chip area increases.

Also, in the systems shown in FIGS. 2A to 3, it is necessary to take into consideration a case that adjacent banks are simultaneously activated, and therefore, it is not possible to adopt a shared sense amplifier system in which sense amplifiers are shared by adjacent banks.

The shared sense amplifier system will be explained with reference to FIG. 4. A sense amplifier 10 is shared by memory cell arrays 8 and 12. A selection switch 9 is provided between the memory cell arrays 8 and 10, and a selection switch 11 is provided between memory cell arrays 12 and the sense amplifier 10. The selection switches 9 and 11 are respectively turned on when the memory cell arrays 8 and 12 are activated, and are respectively turned off except when the memory cell arrays 8 and 12 are activated. Turning on/off of the selection switches 9 and 11 is performed in accordance with an address signal, for example.

By thus using the shared sense amplifier system, a sense amplifier section is shared by two adjacent memory cell arrays so that the chip size is reduced greatly.

As has been described above, according to the systems reported by Jei-Hwan Yoo et al., a local column decoder LCD is provided at an area between memory banks and it is required to take into consideration a case that adjacent banks are activated simultaneously. Therefore, a shared sense amplifier system cannot be adopted in the systems. Consequently, the chip size cannot be reduced much. Particularly when the number of banks is increased, the above-mentioned problem becomes serious more.

Thus, in a conventional bank structure method, there is a problem that the chip size is increased in proportion to the number of banks when realizing a DRAM consisting of a number of banks.

BRIEF SUMMARY OF THE INVENTION

The present invention has an object of providing a DRAM having a multi-bank structure in which a shared sense amplifier system can be adopted at boundaries of all cell array blocks, a column decoder can be shared by banks, and the chip size is small.

A semiconductor memory device according to the present invention comprises a plurality of memory banks each having a plurality of memory cell arrays and a plurality of sense amplifiers such that the memory cell arrays and the sense amplifiers are alternately disposed in a first direction, the memory banks being disposed in a second direction perpendicular to the first direction; a plurality of row decoders respectively provided in the first direction for the plurality of memory banks; a column decoder provided in the second direction with respect to the plurality of memory banks; a plurality of first data lines respectively provided in the second direction for the plurality of memory banks, and connected with the plurality of sense amplifiers in accordance with a signal outputted from the column decoder; a plurality of second data lines provided in the second direction, penetrating through the plurality of memory banks, and shared by the plurality of first data lines disposed for the plurality of memory banks; and a plurality of switching elements each having a first end connected to one of the plurality of first data lines and a second end connected to one of the plurality of second data lines, and controlled by a bank activation signal of a memory bank corresponding to the first data line connected to the first ends.

Preferred embodiments of the semiconductor memory device according to the present invention are as follows.

(1) The plurality of first data lines are formed in a different metal wiring layer from the plurality of second data lines.

(2) In the semiconductor memory device described in (1), the plurality of first data lines and output lines of the plurality of row decoders are formed of a first metal wiring layer, an output line of the column decoder is formed of a second metal wiring layer, and the plurality of second data lines are formed of a third metal wiring layer.

(3) Each of the plurality of switching elements includes a transistor having an end of its current path connected to the first data lines, another end of its current path connected to the second data lines, and a gate supplied with the bank activation signal.

(4) The plurality of switching elements function to amplify and transfer a signal on the plurality of first data lines to the plurality of second data lines. In this structure, the speed is improved.

(5) In the semiconductor memory device described in (4), Each of the plurality of switching elements has a differential amplifier of a current mirror type.

According to the semiconductor memory device of the present invention, memory cell arrays and sense amplifiers can be alternately disposed in a direction perpendicular to the direction in which output lines of row decoders extend, and therefore, the chip area can be reduced to be small even if an ultra-multi-bank structure is adopted by using a shared sense amplifier system.

Another semiconductor memory device according to the present invention comprises: a plurality of memory banks each having a plurality of memory cell arrays and a plurality of sense amplifiers such that the memory cell arrays and the sense amplifiers are alternately disposed in a first direction, the plurality of memory banks being disposed in a second direction perpendicular to the first direction; a plurality of row decoders respectively provided in the first direction for the plurality of memory banks; a column decoder provided in the second direction with respect to the plurality of memory banks; a plurality of second data lines respectively provided in the first direction for the plurality of memory banks; a plurality of third data lines provided in the second direction, penetrating through the plurality of memory banks; and a plurality of first switching elements each having a first end connected to one of the plurality of second data lines and a second end connected to the plurality of third data lines, and controlled by a bank activation signal of a memory bank corresponding to one of the plurality of second data lines connected to the first end, to function to amplify and transfer a signal on the plurality of second data lines to the plurality of third data lines, wherein each of the plurality of memory banks includes a plurality of first data lines provided in the second direction and connected to the sense amplifiers, and a plurality of second switching elements each having a first end connected to one of the plurality of first data lines and a second end connected to one of the plurality of second data lines, and controlled by a cell array activation signal from a memory cell array corresponding to a first data line connected to the first end of one of the plurality of second switching elements. With this semiconductor memory device, since the relay buffer and second and third data lines can be shared by the plurality of memory cell arrays in the same bank, the chip size can be more reduced.

Preferred embodiments of the semiconductor memory device are as follows.

(1) The plurality of first data lines are formed of a first metal wiring layer, the plurality of second data lines are formed of a second metal wiring layer, and the plurality of third data lines are formed of a third metal wiring layer.

(2) Each of the plurality of second switching elements has a transistor having an end of its current path connected to one of the plurality of first data lines, another end of its current path connected to one of the plurality of second data lines, and a gate supplied with a memory cell array activation signal.

(3) Each of the plurality of first switching elements has a differential amplifier of a current mirror type.

Further another semiconductor memory device according to the present invention comprises a plurality of memory banks having a hierarchical word line system including main word lines and sub-word lines, and disposed in a second direction perpendicular to a first direction; second row decoders respectively provided in the first direction for the plurality of memory banks, and having output terminals connected to the main word line; a column decoder provided in the second direction with respect to the plurality of memory banks; first data lines respectively provided in the second direction for the plurality of memory banks, and connected to a plurality of sense amplifiers; second data lines provided in the second direction penetrating through the plurality of memory banks; and switching elements each having a first end connected to one of the first data lines and a second end connected to one of said second data lines, and controlled by a bank activation signal of a memory bank corresponding to one of the second data lines connected to the first end, wherein each of the plurality of memory banks has a plurality of memory blocks disposed in the second direction, each of the plurality of memory blocks has a plurality of memory cell arrays and the plurality of sense amplifiers such that the memory cell arrays and the plurality of sense amplifiers are alternately disposed in the first direction, each of the plurality of memory cell arrays has a plurality of memory cells, the plurality of memory cells are respectively connected to the sub-word lines, and the plurality of memory cell blocks respectively include third row decoders having first ends connected to the main word lines and second ends connected to the sub-word lines, to selectively connect the main word lines to the sub-word lines corresponding to the address signal.

Preferred embodiments of the semiconductor memory device are as follows.

(1) The main word lines are formed of a first metal wiring layer, and the sub-word lines are formed of a gate wiring layer.

(2) A first row decoder for outputting a control signal for controlling the second row decoders is further provided.

(3) In the semiconductor memory device described in (2), a wiring supplied with the control signal outputted from the first row decoder is formed of a third metal wiring layer.

(4) In the semiconductor memory device described in (2), the second row decoders are latch circuits controlled by the control signal outputted from the first row decoder.

(5) The sub-word lines are formed of third word lines consisting of a first metal wiring layer and a gate wiring layer, and are connected with the main word lines in connection areas in the memory cell arrays.

(6) In the semiconductor memory device described in (5), the connection areas are provided at center portions of the third word lines.

As has been described above, according to the present invention, both the row decoder structure and data line structure can be adjustably made in hierarchical structure, and furthermore, the chip area can be reduced to be small.

In addition, the sense amplifiers are connected through only the switches controlled by a signal outputted from row decoders, and therefore, the chip area can be reduced to be small even if a ultra-multi-bank structure is adopted.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

In the following, embodiments of the present invention will be explained with reference to the drawings.

Figure 1A:
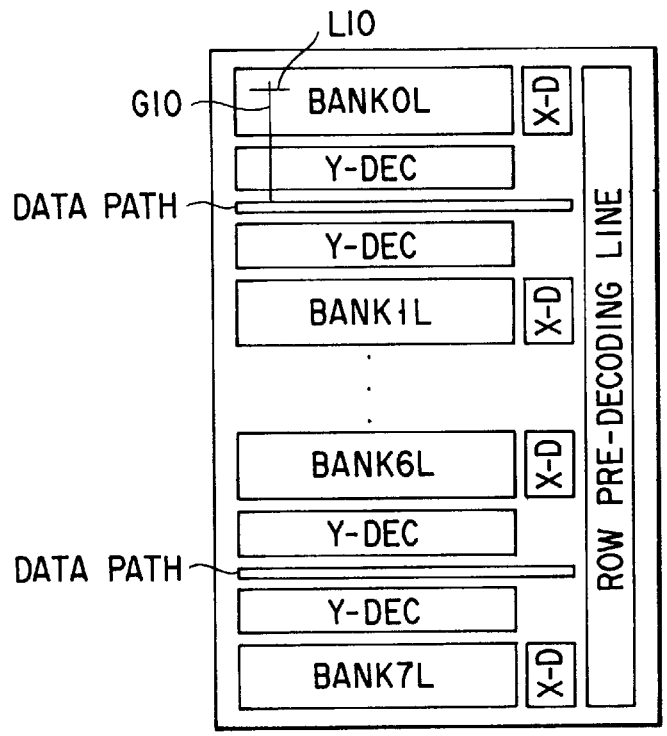
FIGS. 1A and 1B are views showing a first example of a conventional system.
Figure 1B:
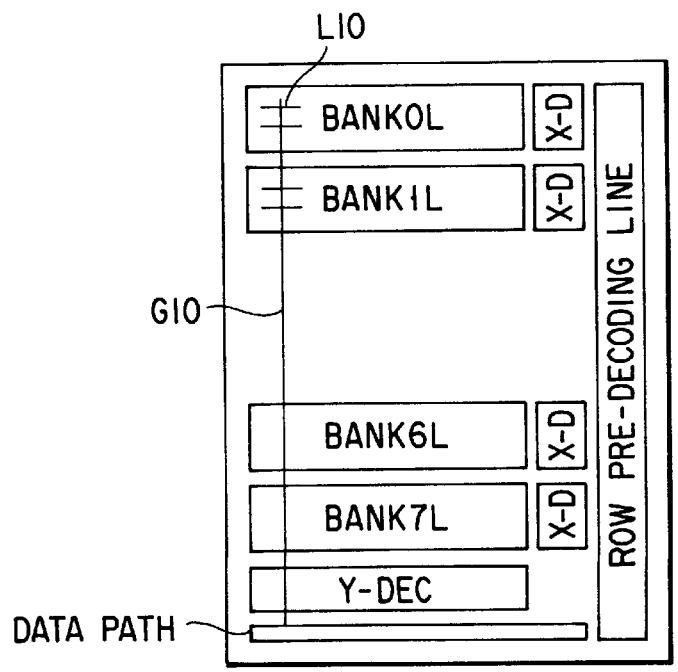
Figure 2A:
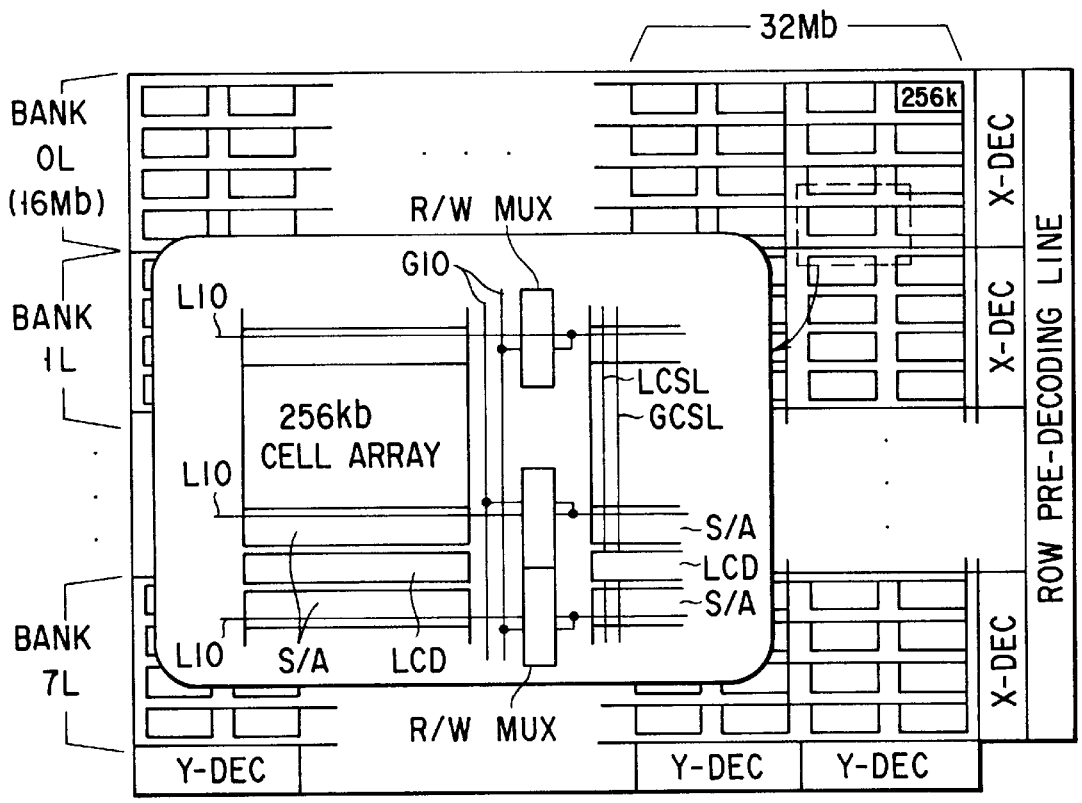
FIGS. 2A and 2B are views specifically showing the first conventional example shown in FIGS. 1A and 1B.
Figure 2B:
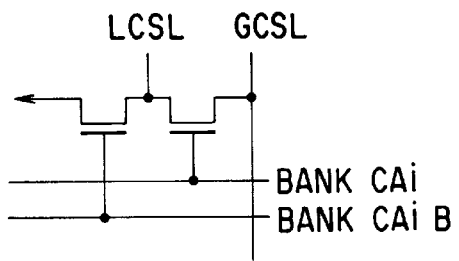
Figure 5:
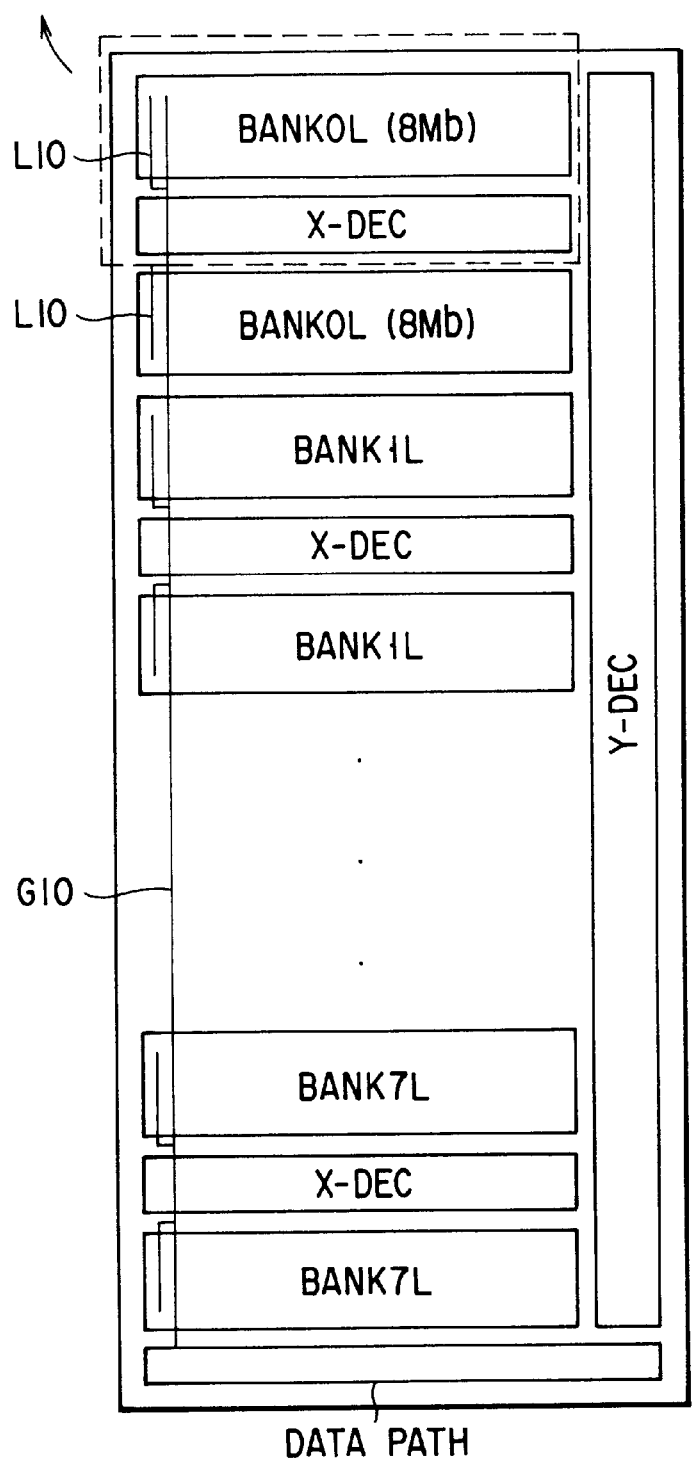
FIG. 5 is a view showing a first embodiment of the present invention.
Figure 6:
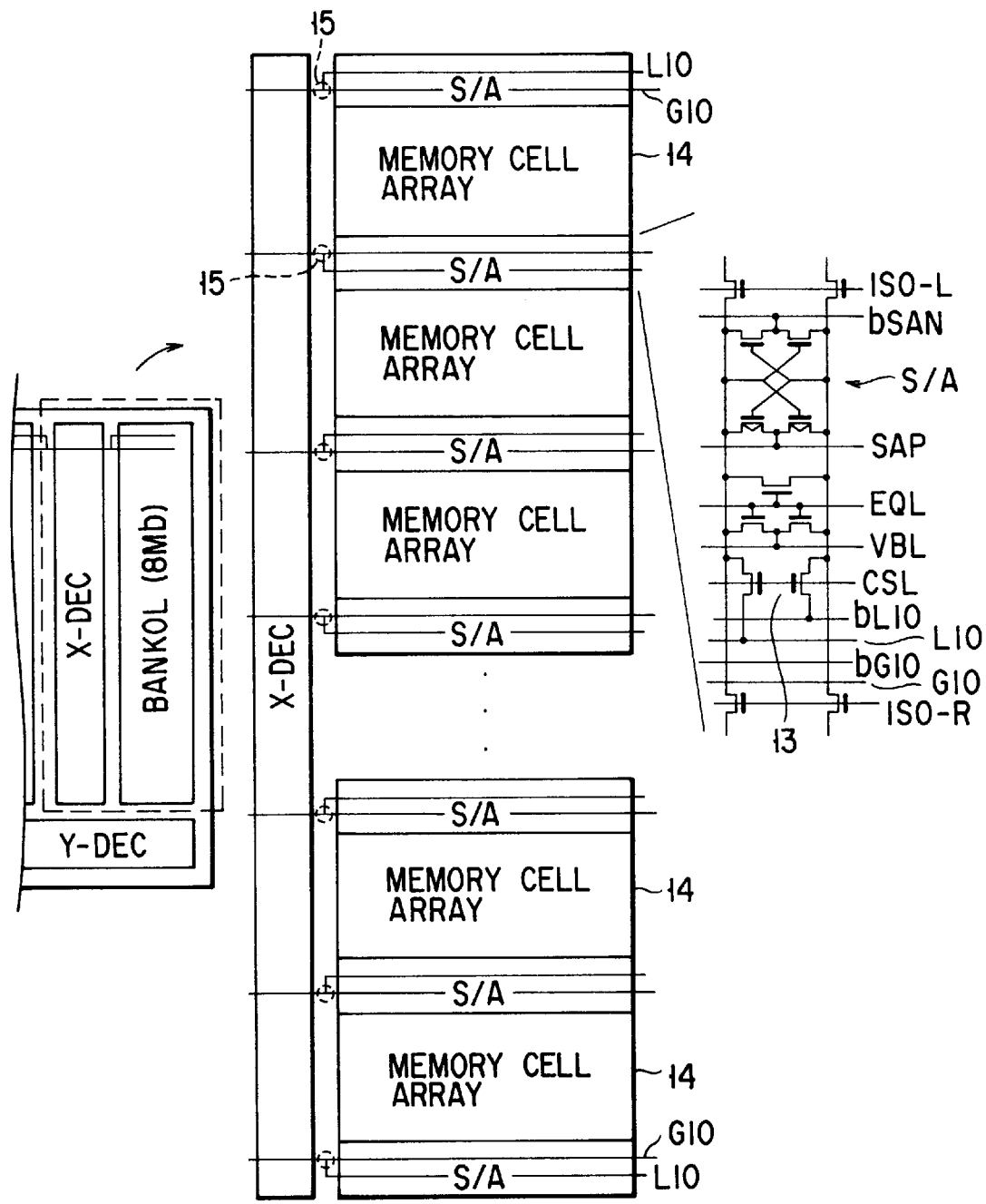
FIG. 6 is a view also showing the first embodiment of the present invention.

FIGS. 5 and 6 show a first embodiment of the present invention. FIG. 5 shows a schematic structure of a semiconductor memory device according to the present invention, and FIG. 6 more specifically shows a memory bank of the semiconductor memory device shown in FIG. 5. The structure shown in FIG. 5 expresses a core macro of a DRAM and has a memory capacity of 128M bits to be compared with a conventional structure shown in FIGS. 1A and 1B.

Each of memory banks BANK0L to BANK7L has a memory capacity of 16M bits. Each of the memory banks BANK0L to BANK7L is divided at a center section into upper and lower parts in each of which an area having a capacity of 8M bits is formed.

The memory banks BANK0L to BANK7L are disposed longitudinally in line as shown in FIG. 5.

Row decoders X-DEC are respectively provided for the banks BANK0L to BANK7L. Each of the row decoder X-DEC is provided so as to extend laterally between upper and lower parts of a bank. The row decoder X-DEC decodes a part of a row address signal and activates a word line WL corresponding to the row address signal.

A column decoder Y-DEC is provided close to the right side of the banks BANK0L to BANK7L along the direction in which the banks are disposed. For example, the column decoder Y-DEC decodes a part of an address signal and causes an output line CSL corresponding to the address signal to rise to a high level.

A second data line GIO is provided penetrating through the banks BANK0L to BANK7L. The second data line is a pair of data lines consisting of data lines GIO and bGIO ("b" means inverted in the following explanation). One or more pairs of data line GIO are provided. The second data line is connected to an output buffer or the like not shown through a data bus.

A first data line LIO is provided for each of divided parts of banks such that the first data lines LIO extend in parallel to each of the second data line GIO. The second data line GIO is connected to the first data lines LIO of the bank BANK0L to BANK7L through switching elements 15. First data lines LIO corresponding in number to the second data line GIO are provided for each bank.

A switching element 15 (which will be described in details later) is provided for each of the first data lines LIO of each bank. The switching element 15 is supplied with a bank activation signal CAi. The switching element 15 is turned on when the bank activation signal is at a high level, and is turned off when the bank activation signal is at a low level. The bank activation signal CAi is generated by decoding a part of an address signal by an address decoder not shown.

FIG. 6 shows one of the divided parts of a memory bank and sense amplifiers used of the memory bank.

A memory bank comprises a plurality of memory cell arrays 14 and a plurality of sense amplifiers S/A. The memory cell arrays 14 and the sense amplifiers S/A are alternately arranged along a direction in which a row decoder extends, i.e., in a direction perpendicular to a direction in which a word line (WL: not shown) extends as an output signal line of the row decoder X-DEC. Unlike prior art examples, no local column decoders are required and sense amplifier areas are provided adjacent to each memory cell array. Therefore, one sense amplifier S/A can be shared by two memory cell arrays 14. Specifically, all the memory cell arrays can adopt a shared sense amplifier system.

As shown in FIG. 6, a first data line LIO and a second data line GIO are provided on each of the sense amplifiers S/A.

Transistors 13 each having a gate connected to a column decoder output line CSL are respectively provided between a sense amplifier and first data line pairs LIO and bLIO.

Also, in the circuit of the sense amplifier shown in FIG. 6, bSAN denotes a NMOS sense amplifier activation signal line, and SAP denotes a PMOS sense amplifier activation signal line. EQL denotes a bit line equalize activation signal line. VBL denotes a bit line pre-charge potential line. CSL denotes a column decoder output line. LIO and bLIO denote first data line pairs, and GIO and bGIO denote second data line pairs. ISO-L and ISO-R denote common sense amplifier control signal lines. Signals supplied to the common sense amplifier control signal lines ISO-L and ISO-R are generated by X-DEC.

Figure 7:
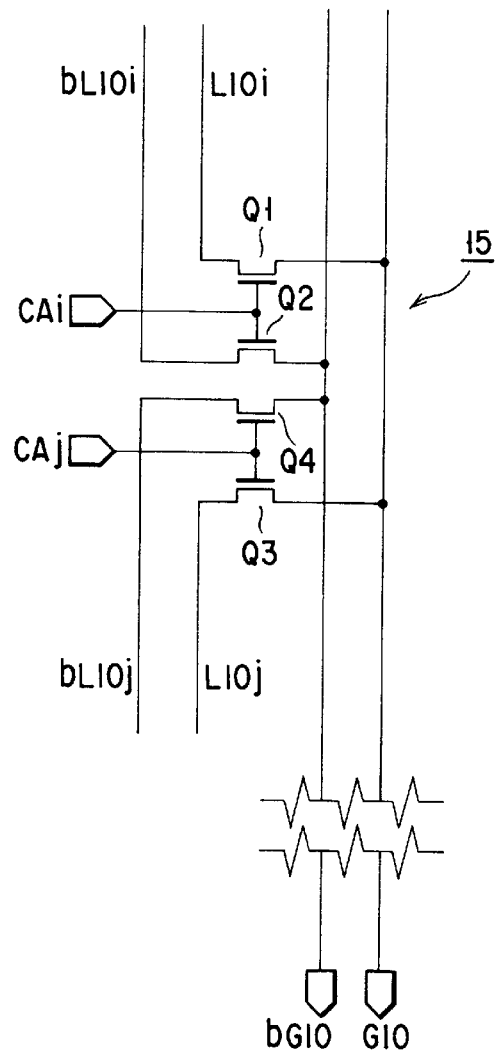
FIG. 7 is a view showing a switching element used in the first embodiment of the present invention.

FIG. 7 shows an example of a switching element 15 used in the present embodiment.

For example, first data line pairs in a bank BANKiL are denoted by LIOi and bLIOi, and first data line pairs in a bank BANKjL are denoted by LIOj and bLIOj. In addition, second data line pairs are denoted by GIO and bGIO.

An end of a current path of a NMOS transistor Q1 is connected to the first data line LIOi and another end of the current path of the transistor Q1 is connected to the second data line GIO. An end of a current path of a NMOS transistor Q2 is connected to the first data line bLIOi and another end of the current path of the transistor Q2 is connected to the second data line bGIO. Gates of the transistors Q1 and Q2 are supplied with a bank activation signal CAi for activating the bank BANKiL.

Likewise, an end of a current path of a NMOS transistor Q3 is connected to the first data line LIOj and another end of the current path of the transistor Q3 is connected to the second data line GIO. An end of a current path of a NMOS transistor Q4 is connected to the first data line bLIOj and another end of the current path of the transistor Q4 is connected to the second data line bGIO. Gates of the transistors Q3 and Q4 are supplied with a bank activation signal CAj for activating the bank BANKjL.

Operation of the switching element will now be explained. For example, when the bank activation signal rises to a high level thereby activating the bank BANKiL, the transistors Q1 and Q2 are rendered conductive and the transistors Q3 and Q4 are kept turned off. As a result, second data line pairs GIO and bGIO are respectively connected to the first data line pairs LIOi and bLIOi. Data stored only in the bank thus activated is transferred to the second data line pairs GIO and bGIO, or data is written from the second data line pairs GIO and bGIO into memory cells of the bank activated.

Hereinafter, operation of the semiconductor memory device shown in FIGS. 5 and 6 will be explained.

At first, a part of an address signal supplied from the outside is decoded by an address decoder (not shown), and a part of the rest of the address signal is decoded by a column decoder Y-DEC. As a result, for example, a bank activation signal CAi rises to a high level and an output line CSL of the column decoder Y-DEC rises to a high level. The switching elements of a BANKiL is turned on, and second data line pairs GIO and bGIO are connected to first data line pairs LIOi and bLIOi of the bank BANKiL. The first data line pairs LIOi and bLIOi are connected to the sense amplifier S/A connected to the column decoder output line CSL which is at a high level.

Another part of the address signal is decoded by a row decoder X-DEC, and a word line corresponding to the address signal is activated. As a result, a memory cell is selected from the BANKiL.

Data is read from the memory cell to the second data line GIO or data is written from the second data line GIO into the memory cell thus selected.

Thus, according to the present embodiment, banks are disposed in a direction in which word lines extend, i.e., in a direction in which output lines of the row decoders XDEC extend. Further, in a bank, memory cell arrays and sense amplifiers are alternately disposed in a direction perpendicular to the direction in which the output lines of the decoders X-DEC extend, and sense amplifiers are respectively provided to be adjacent to memory cell arrays. Therefore, it is possible to adopt a shared sense amplifier system, so that the chip size can be reduced to be smaller than in prior art examples even if the number of banks is increased.

Figure 3:
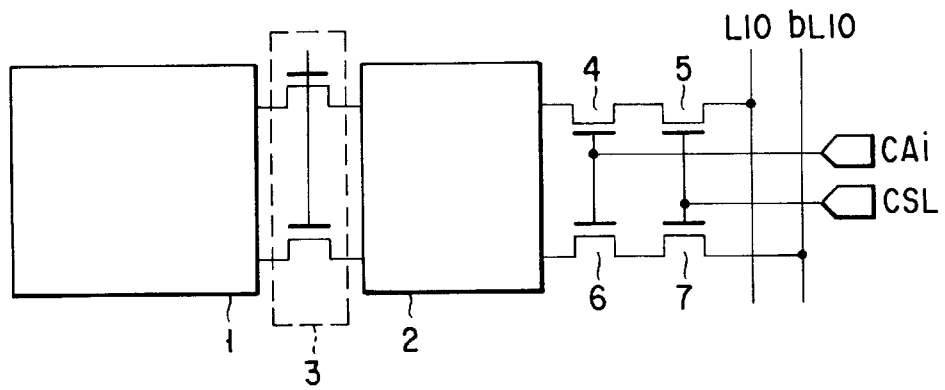
FIG. 3 is a view showing a second conventional example.
Figure 4:
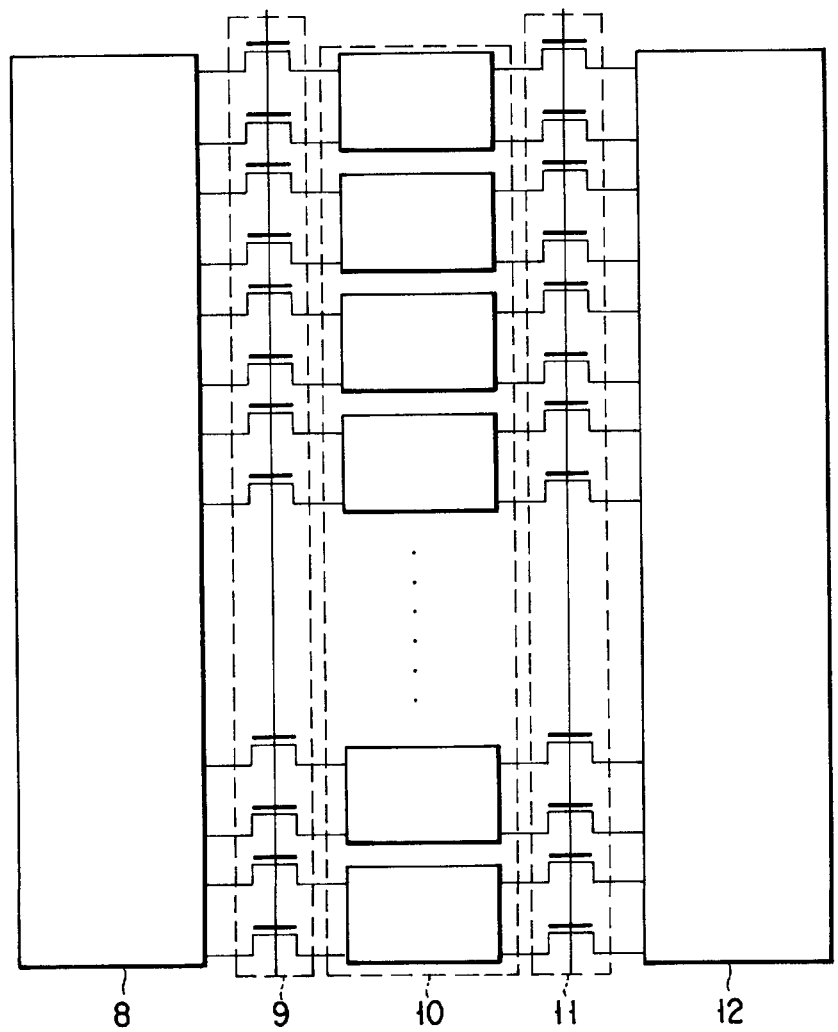
FIG. 4 is a view for explaining a shared sense amplifier system.

Since output lines CSL of the column decoder Y-DEC are respectively provided for banks, a plurality of banks do not use in common an output line CSL. Therefore, as shown in FIG. 6, a switch element 13 provided between an input/output terminal of a sense amplifier and a first data lines LIO needs to be turned on/off only by a signal on a column decoder output line CSL. The switch element need not be supplied with a bank activation signal CAi, unlike the prior art example shown in FIG. 3. As a result, the chip area can be reduced and the operation speed of the semiconductor memory device can be increased.

Further, since a switching element 15 is provided between a first data line LIO and a second data line GIO, a second data line GIO can be shared by a plurality of banks.

As described above, according to the present embodiment, an increase of the chip size in accordance with an increase of the number of banks can be restricted to a minimum.

Figure 8:
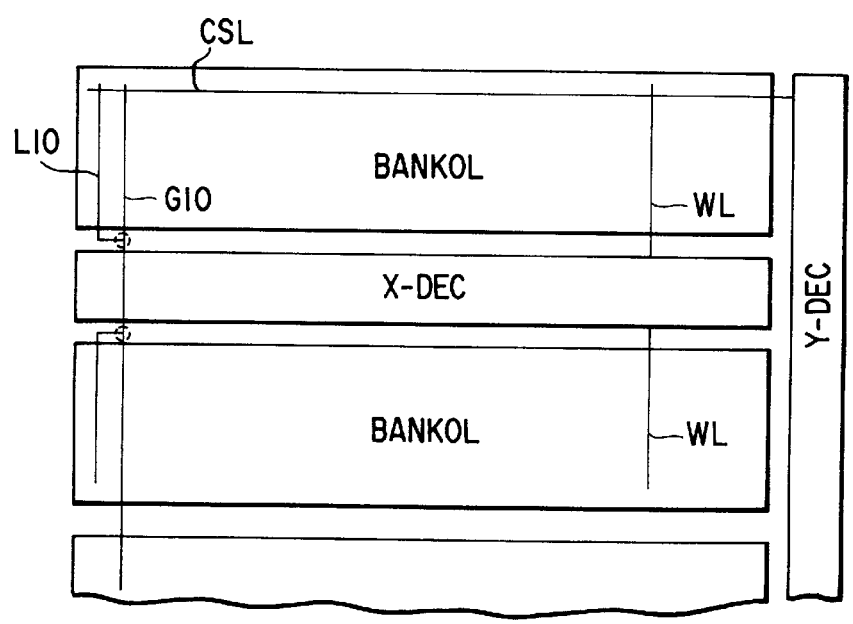
FIG. 8 is a view showing a wiring layer in the first embodiment of the present invention.

The second data lines GIO (including bGiO) should preferably be formed in a wiring layer different from a wiring layer in which first data lines LIO (bLIO) are formed. For example as shown in FIG. 8, output lines WL of row decoders X-DEC and first data line LIO are formed in a first metal wiring layer, and output lines CSL of a column decoder Y-DEC are formed in a second metal wiring layer. Second data lines GIO are formed in a third metal wiring layer. In this manner, the chip size can be reduced much more.

Next, a second embodiment of the present invention will be explained below. In the second embodiment, the switching elements 15 shown in the first embodiment are replaced with circuits shown in FIG. 9. The other components of the second embodiment than the switching elements 15 are the same as those shown in the first embodiment.

A relay buffer 51 as a switching element is provided for every pair of first data lines LIOi and bLIOi.

The first data line LIOi is connected to the gate of an n-channel MOS transistor Q42, and the first data line bLIOi is connected to the gate of an n-channel MOS transistor Q44. A bank activation signal CAi is supplied to the gate of an n-channel MOS transistor 41. The source of the n-channel MOS transistor Q41 is grounded, and the drain of the n-channel MOS transistor Q41 is connected to the sources of the n-channel MOS transistors Q42 and Q44. The drain of the n-channel MOS transistor Q42 is connected to the second data line bGIO and the drain of the p-channel MOS transistor Q43. The drain of the n-channel MOS transistor Q44 is connected to the drain and gate of a p-channel MOS transistor Q45 and to the gate of a p-channel MOS transistor Q43. The sources of the p-channel MOS transistors Q43 and Q45 are supplied with a power supply voltage Vcc.

The first data line LIOi is connected to the gate of an n-channel MOS transistor Q47, and the first data line bLIOi is connected to the gate of an n-channel MOS transistor Q49. A bank activation signal CAi is supplied to the gate of an n-channel MOS transistor Q46. The source of the n-channel MOS transistor Q46 is grounded, and the drain of the n-channel MOS transistor Q46 is connected to the sources of the n-channel MOS transistor Q47 and Q49. The drain of the n-channel MOS transistor Q49 is connected to the second data line GIO and the drain of a p-channel MOS transistor Q50. The drain of the n-channel MOS transistor Q47 is connected to the drain and gate of a p-channel MOS transistor Q48 and to the gate of a p-channel MOS transistor Q50. The sources of the p-channel MOS transistors Q48 and Q50 are supplied with a power supply voltage Vcc.

The relay buffer circuit 51 amplifies signals of the first data lines LIOi and bLIOi to be outputted to the second data lines GIO and bGIO, respectively, when a bank activation signal CAi supplied rises to a high level. When the bank activation signal CAi is at a low level, the first data lines LIOi and bLIOi are electrically disconnected from the second data lines GIO and bGIO.

The second data lines GIO and bGIO have a long wiring length, and therefore, the capacitance of the second data lines GIO and bGIO are relatively large. In the present embodiment, data transferred from a memory cell to the first data lines LIOi and bLIOi are amplified and sent to the second data lines GIO and bGIO. Therefore, data can be transferred at a high speed even if the capacitance of the second data line GIO and bGIO are large. In particular, column access can be performed at a high speed and the burst transfer speed can be increased.

The present invention has the same structure as the first embodiment except that relay buffers are used as switching elements, and therefore achieves the same advantages as the first embodiment.

Figure 9:
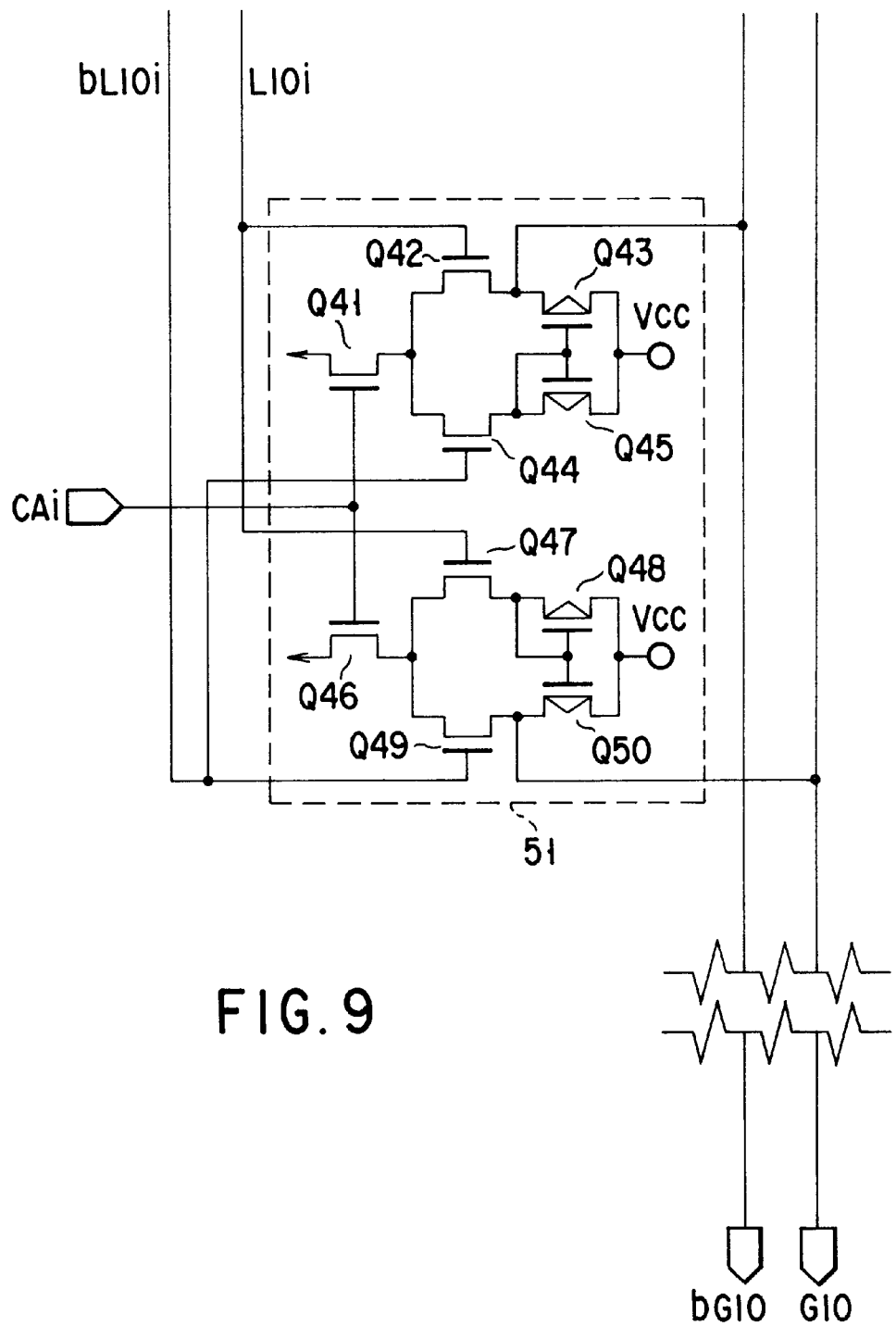
FIG. 9 is a view showing a switching element used in a second embodiment of the present invention.

In the embodiment shown in FIG. 9, a differential amplifier of a current mirror type is used as a relay buffer. The relay buffer is not limited to this type of circuit.

Figure 10:
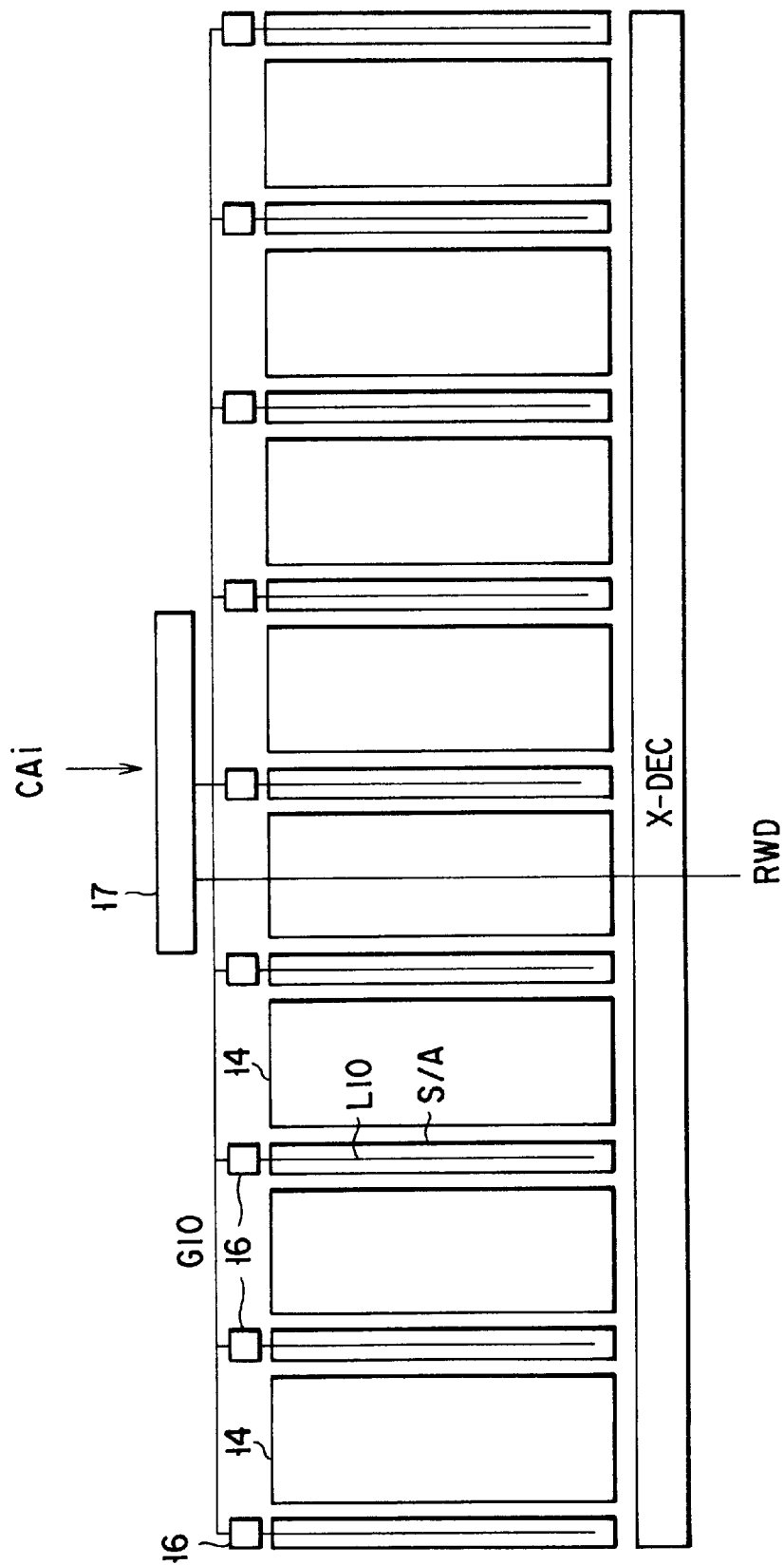
FIG. 10 is a view showing a third embodiment of the present invention.

Next, a third embodiment of the present invention will be explained below. The present embodiment is attained by changing the structure inside the memory bank of the first embodiment, as shown in FIG. 10. The second data line GIO shown in FIG. 5 is replaced with a third data line RWD in the present embodiment.

FIG. 10 shows an internal structure of a bank according to the present embodiment.

As shown in FIG. 10, for example, nine sense amplifiers S/A and eight memory cell arrays 14 are alternately provided along a row decoder X-DEC.

The sense amplifier S/A is the same as that shown in FIG. 6. The sense amplifiers S/A are connected to the first data lines LIO. The first data lines are provided independently of each other for sense amplifiers S/A, respectively, in parallel with the third data line RWD. The first data lines LIO are connected to ends of the switching elements 16. The switching elements 16 are respectively provided for first data lines LIO.

For example, the switching element 16 consists of a circuit shown in FIG. 7. However, in the circuit shown in FIG. 7, the signal supplied to the gates of the NMOS transistors Q1 to Q4 is not a bank activation signal but an array activation signal. The other ends of the switching elements are connected to the second data line GIO. The second data lines GIO is provided in a direction parallel to output lines of the column decoder Y-DEC and is connected to a plurality of switching elements 16 using a relay buffer 17 in common, e.g., eight switching elements 16 in the example shown in FIG. 10.

Corresponding to an array activation signal, one of the switching elements 16 connected to the second data lines GIO is turned on, and the first data line LIO of a corresponding memory cell array is connected to the second data line GIO.

The second data line GIO should preferably be formed in the same metal wiring layer as that of the output lines of the column decoder Y-DEC, e.g., the second metal wiring layer.

The second data line GIO is connected to an end of the relay buffer 17. The other end of the relay buffer 17 is connected to a third data line RWD. Further, the relay buffer 17 is supplied with a bank activation signal CAi. The relay buffer 17 is the same as that shown in FIG. 9, for example. In this case, the second data line GIO and the third data line RWD of the present embodiment respectively correspond to the first data line LIO and the second data line GIO in the circuit shown in FIG. 9.

The third data line RWD is the same as the second data line GIO in the embodiment shown in FIGS. 5 and 6. Specifically, a third data line RWD is shared by a plurality of banks and is provided in parallel with output lines of row decoders X-DEC. The third data line RWD is formed in a third metal wiring layer.

According to the present embodiment, data in a selected memory cell array is supplied to a first data line LIO and is further transferred to a second data line GIO through a switching element 16. Data on the second data line is amplified by a relay buffer 17 and is transferred to a third data line RWD at a high speed.

Thus, in the present embodiment, relay buffers 17 each having an amplification function are provided and each of the relay buffers 17 is shared by a plurality of cell arrays. Therefore, data can be transferred onto a data line RWD at a high speed and the chip area can be reduced to be small. Also, the same advantages as those of the first embodiment can be obtained.

Next, a fourth embodiment of the present invention will be explained below.

In the fourth embodiment, the switching elements 16 of the third embodiment are replaced with switches of a current mirror type each having an amplification function. The other components than the switches are the same as those of the third embodiment.

Figure 11:
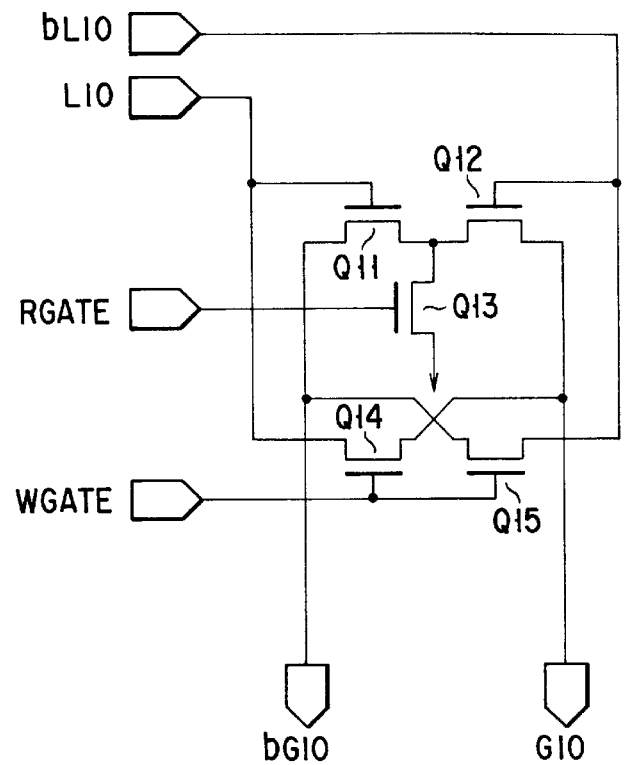
FIG. 11 is a view showing a fourth embodiment of the present invention.

FIG. 11 shows a circuit example of a switch of a current mirror type with an amplification function used in the fourth embodiment.

The first data line LIO is connected to the gate of a NMOS transistor Q11. An end of a current path of the transistor Q11 is connected to the second data line bGIO, and another end of the current path of the transistor Q11 is connected to an end of a current path of a NMOS transistor Q13. The gate of the transistor Q13 is supplied with a read activation signal RGATE and another end of the current path of the transistor Q13 is grounded.

The data line bLIO is connected to the gate of a NMOS transistor Q12. An end of a current path of the transistor Q12 is connected to the second data line GIO, and another end of the current path of the transistor Q12 is connected to an end of the current path of the transistor Q13.

The first data line LIO is connected to an end of a current path of NMOS transistor Q14. The gate of the transistor Q14 is supplied with a write activation signal WGATE, and another end of the current path of the transistor Q14 is connected to the second data line GIO.

In addition, the first data line bLIO is connected to an end of a current path of a NMOS transistor Q15. The gate of the transistor Q15 is supplied with a write activation signal WGATE, and another end of the current path of the transistor Q15 is connected to the second data line bGIO.

When reading data from a memory cell, the read activation signal RGATE rises to a high level. Therefore, signals on the first data line pairs LIO and bLIO are amplified in accordance with a difference in conductance between NMOS transistors Q11 and Q12 and are read onto the second data line pairs GIO and bGIO. Thus, the switching element operates as an amplifier of a current mirror type. As a result, data on the first data line pairs LIO and bLIO can be transferred onto second data line pairs GIO and bGIO at a high speed.

Meanwhile, when writing data into a memory cell, the write activation signal WGATE rises to a high level. As a result, the transistors Q14 and Q15 are rendered conductive and data on the second data line pairs GIO and bGIO is supplied to the first data lines LIO and bLIO, respectively.

In the third embodiment described above, since a second data line GIO is shared by a plurality of memory cell arrays, the wiring capacity of the second data line GIO is increased, thereby hindering high speed operation. However, since the present embodiment uses switching elements each having an amplification function, cell data can be read out onto the second data line GIO at a high speed.

Since the present embodiment is the same as the third embodiment except that switch elements of a current mirror type having an amplification function are used, the same advantages as those of the third embodiment can be obtained.

A fifth embodiment of the present invention will now be explained. In the present embodiment, each of memory banks is further divided into a plurality of blocks along the direction of output signal lines of row decoders. In addition, row decoders adopting a hierarchical decoding system are used. In the present embodiment, the structure relating to data lines, including data lines, switching elements, relay buffers, and the like, is the same as that used in the first to fourth embodiments described above.

Figure 13:
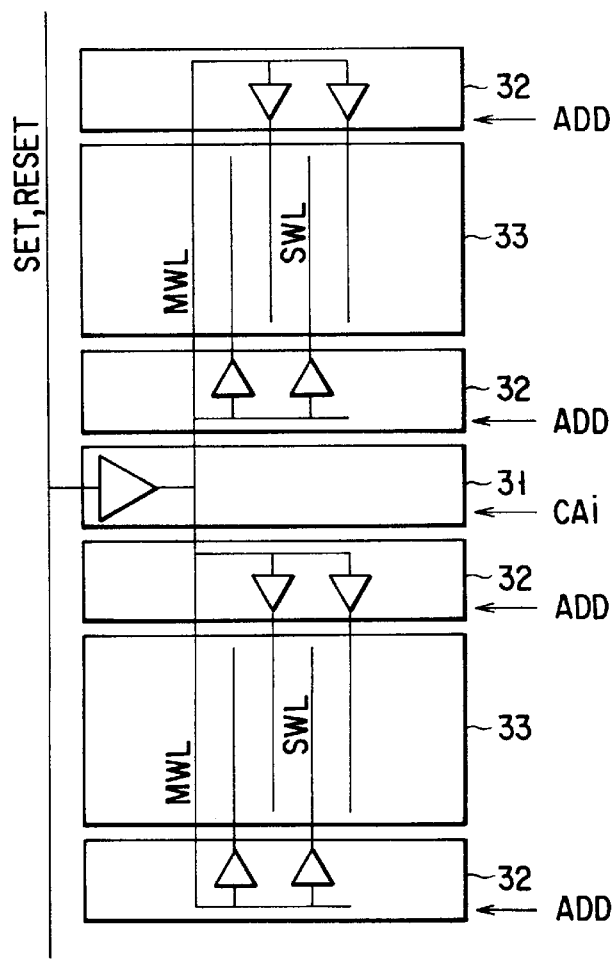
FIG. 13 is a view also showing the fifth embodiment of the present invention.
Figure 12:
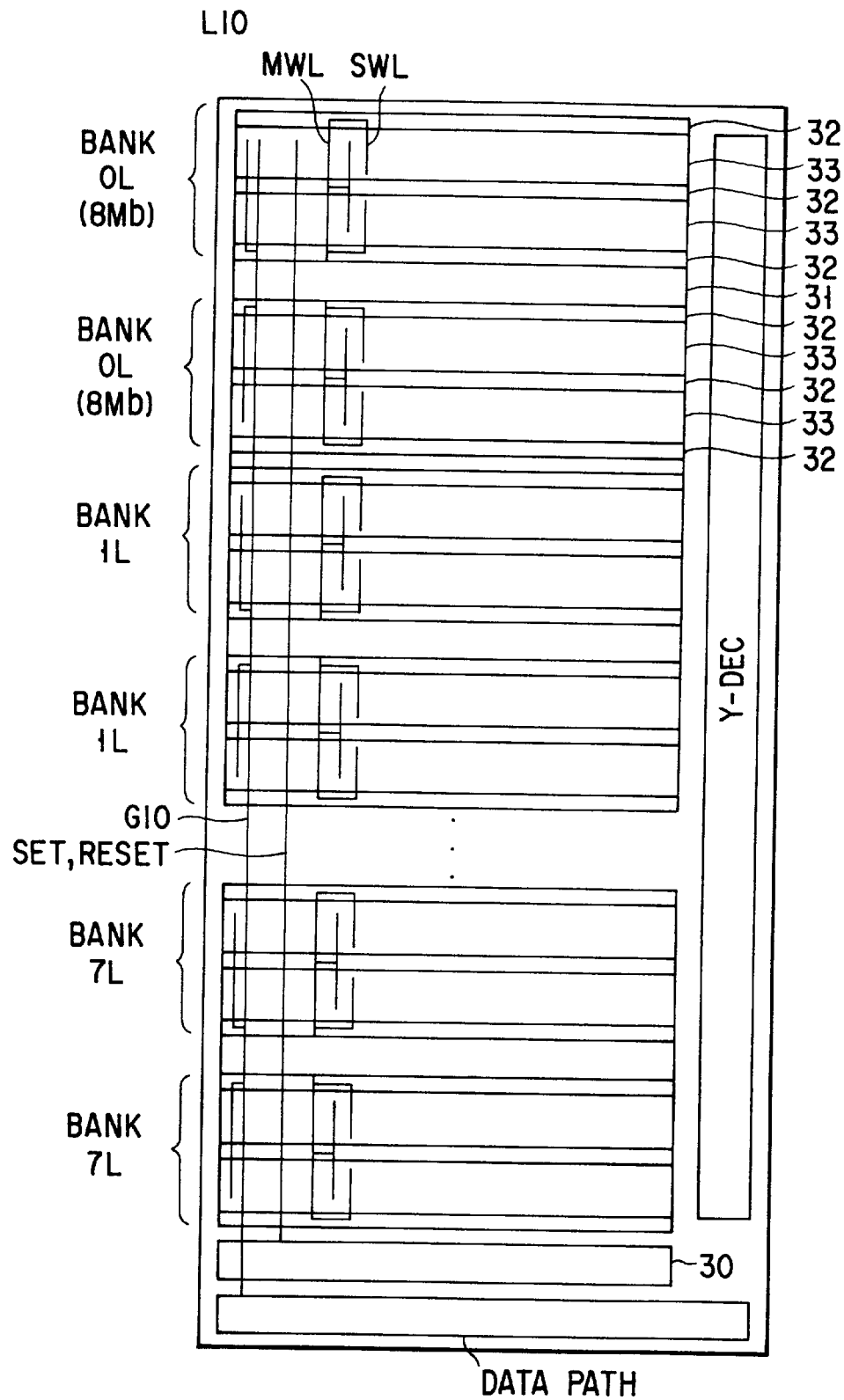
FIG. 12 is a view showing a fifth embodiment of the present invention.

In the following, an example of a hierarchical decoding system will be explained with reference to FIGS. 12 and 13. FIG. 12 shows the entire structure of a semiconductor memory device, and FIG. 13 shows a part of a memory bank of the semiconductor memory device shown in FIG. 12.

A first row decoder 30 is provided between a data bus and a bank BANK7L, for example. The first row decoder 30 generates a word line activation signal SET and a word line deactivation signal RESET. The output signal lines SET and RESET should preferably be formed in a third or higher metal wiring layer to reduce the chip area. The output signal lines SET and RESET of the first decoder 30 are shared by a plurality of banks BANK0L to BANK7L.

Each of the memory banks BANK0L to BANK7L has a memory capacity of 16M bits and is divided into upper and lower parts, like in the first embodiment.

Second row decoders 31 are provided for each of the banks BANK0L to BANK7L. In the example shown in FIG. 12, the second row decoder 31 is provided between the two divided parts of the bank. The second row decoder 31 is supplied with a word line activation signal SET, a word line deactivation signal RESET, and a bank selection signal CAi, and is connected with main word lines MWL of the banks. The main word lines MWL are provided in each bank.

Each of the two divided parts of the memory bank is further divided into upper and lower parts. In the example shown in FIG. 12, each of 16M bits memory banks BANK0L to BANK7L is divided into four blocks 33 each having a capacity of 4M bits.

Third decoders 32 are respectively provided above and below each of the blocks 33. Each memory bank is therefore provided with a plurality of third row decoders 32. The third row decoders 32 are connected with a main word line MWL and a plurality of sub-word lines SWL and are supplied with an address signal ADD.

Figure 14:
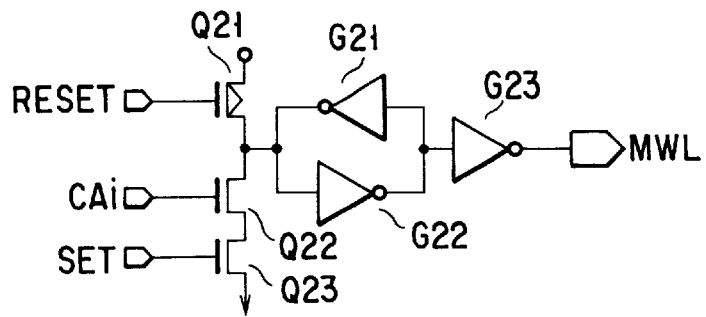
FIG. 14 is a view showing a second decoder used in the fifth embodiment of the present invention.

FIG. 14 shows a circuit example of the second row decoder 31.

As shown in FIG. 14, the source of a PMOS transistor Q21 is supplied with a power supply voltage, and the gate of a transistor Q21 is connected to the output signal line RESET of the first row decoder 30. The drain of a NMOS transistor Q22 is connected to the drain of the transistor Q21, and the gate of the transistor Q22 is supplied with a bank activation signal CAi. The drain of a NMOS transistor Q23 is connected to the source of the transistor Q22, and the gate of the transistor Q23 is supplied with the output signal line SET of the first row decoder. The source of the transistor Q23 is grounded. The connection point between the drains of the transistors Q21 and Q22 is connected to an input terminal of an inverter G22 and an output terminal of an inverter G21. An output terminal of the inverter G22 is connected to an input terminal of the inverter G21 and an output terminal of an inverter G23. The output terminal of the inverter G23 is connected to the main word line MWL. The main word line is formed in, for example, the first metal wiring layer.

The second row decoder 31 controls the state of the main word line MWL in accordance with output signals SET and RESET from the first row decoder 30 and a bank activation signal CAi. Specifically, when the word line activation signal SET and the bank activation signal CAi rise to a high level, the main word line MWL is activated. In addition, a pulse signal of a low level is supplied as a word line deactivation signal RESET, the main word line MWL is deactivated.

Thus, the second row decoder 31 latches the state of the word line MWL. Therefore, a plurality of banks BANK0L to BANK7L can be controlled independently of each other.

Further, a plurality of row decoders 32 are provided in one bank.

Figure 15:
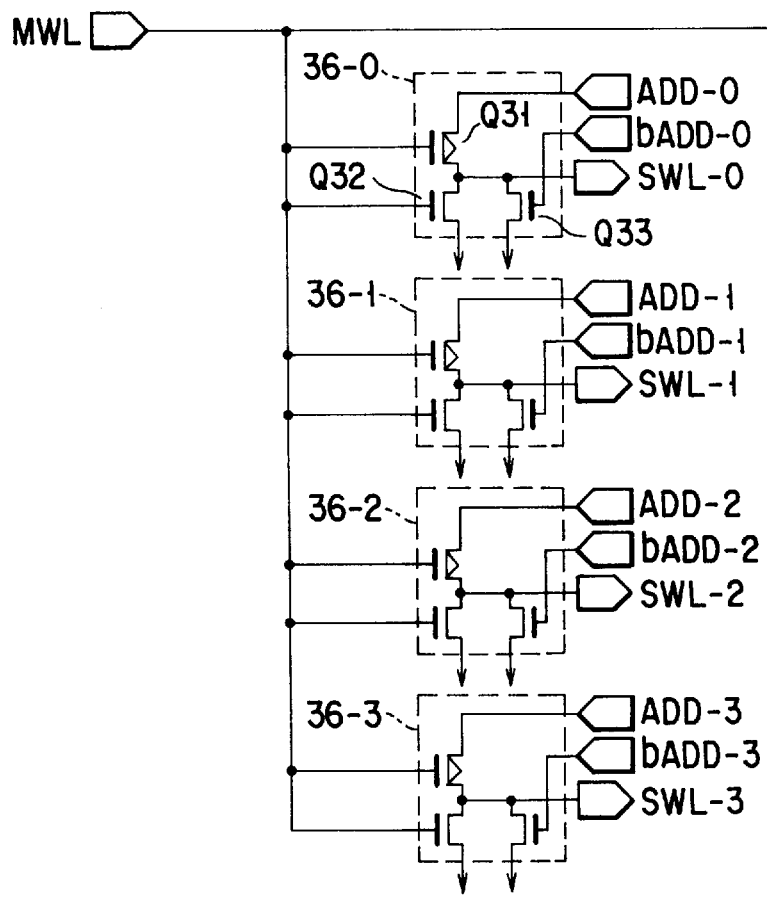
FIG. 15 is a view showing a third decoder of the present invention.

FIG. 15 shows a circuit example of a third row decoder 32. In the circuit shown in FIG. 15, four third row decoders 36-0 to 36-3 are provided for one main word line MWL. ADD-0 to ADD-3 denote address signals, and bADD-0 to bADD-3 respectively denote inverted signals of address signals ADD-0 to ADD-3. SWL-0 to SWL-3 denote sub-word lines.

In the third row decoder 36-0, the source of a PMOS transistor Q31 is supplied with an address signal ADD-0, and the gate of the transistor Q31 is connected to the main word line MWL. The drain of a NMOS transistor Q32 is connected to the drain of the transistor Q31, and the gate of the transistor Q32 is connected to the main word line MWL. The source of the transistor Q32 is grounded. The drain of a NMOS transistor Q33 is connected to the drain of the transistor Q31, and the gate of the transistor Q33 is supplied with an address signal bADD-0. The source of the transistor Q33 is grounded. The connection point between the drains of the transistors Q31, Q32, and Q33 is connected to the sub-word line SWL-0.

Each of the third row decoders 36-1 to 36-3 has the same structure as the third row decoder 36-0, and the third row decoders 36-1 to 36-3 respectively supply signals for sub-word lines SWL-1 to SWL-3 in accordance with address signals ADD-1 to ADD-3 and bADD-1 to bADD-3 and the signal on the main word line MWL.

In the third row decoder 32, the address signals ADD-0 to ADD-3 and bADD-0 and bADD-3 are selectively activated in accordance with an address of a memory cell to be activated, and one of the sub-word lines SWL-0 to SWL-3 corresponding to the memory cell is connected to the main word line MWL.

Thus, in the present embodiment, each bank is further divided into a plurality of blocks along the direction of the signal lines of row decoders, and the row decoders adopt a hierarchical row decoding system.

In general, among metal wiring layers, the first metal wiring layer is formed with the smallest width by a micro-processing technique. In the present embodiment, by adopting a hierarchical row decoding system, the number of output lines of row decoders formed in the first metal wiring layer is reduced so that defects of fine small signal lines due to processing can be reduced.

Specifically, sub-word lines SWL are connected to transfer gates (not shown) of memory cells and are generally formed of a gate electrode wiring. Therefore, the first metal wiring layer need not be used as a wiring for sub-word lines, and the number of wirings in the first metal wiring layer can be reduced. As a result of this, the wiring pitch of metal wirings in the first layer can be maintained wide and a high manufacturing yield can be attained even if downsizing of the wiring width proceeds.

Further, in the present embodiment, the same advantages as those of the first to fourth embodiments can be attained.

Next, a sixth embodiment of the present invention will be explained. The sixth embodiment is different from the fifth embodiment in the layout of the sub-word lines SWL in each bank, and the other components than the sub-word lines are the same as those of the fifth embodiment.

Figure 16:
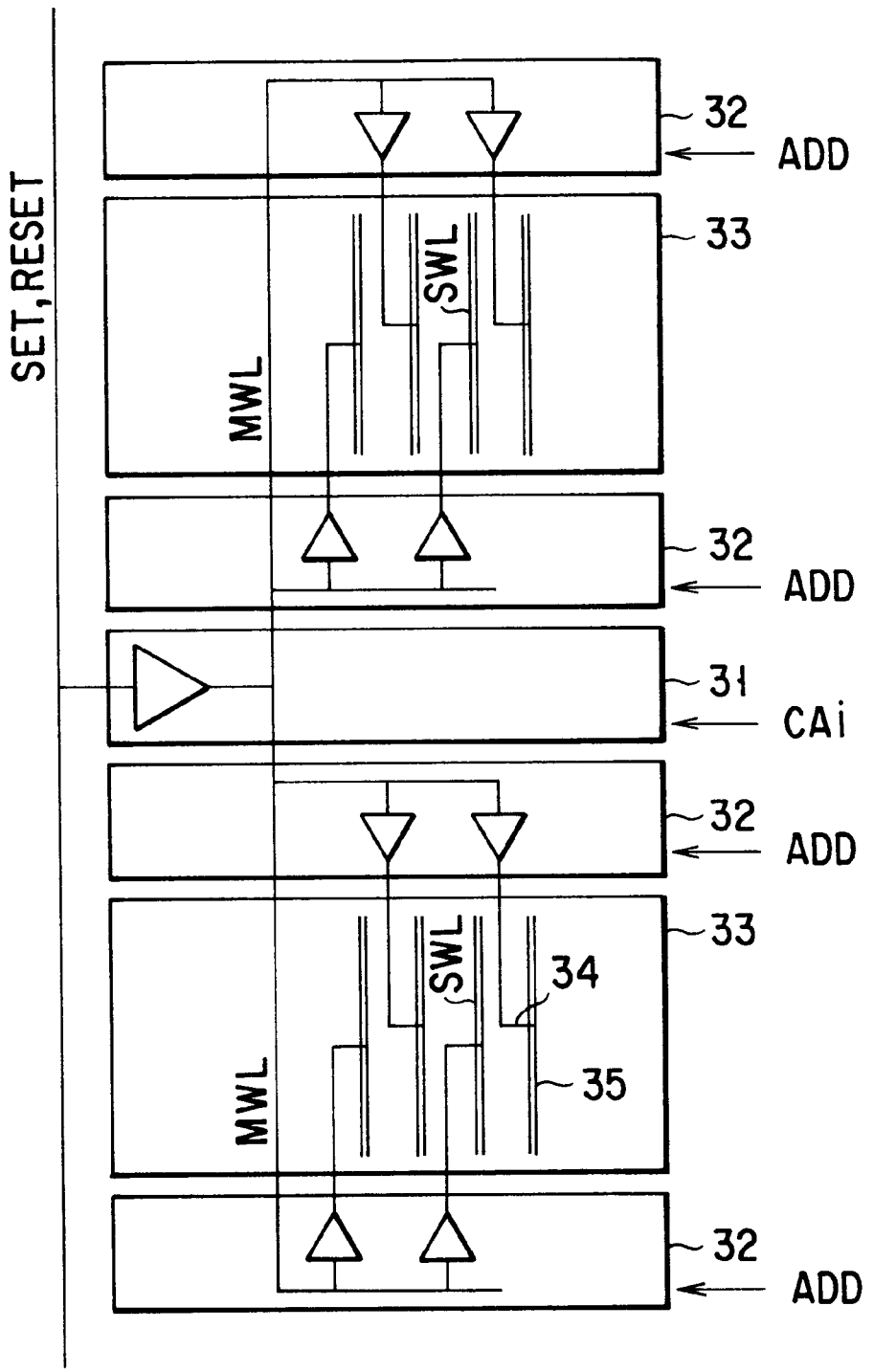
FIG. 16 is a view showing a sixth embodiment of the present invention.

FIG. 16 shows a structure inside a bank. Like in the fifth embodiment, each of the banks is divided into four blocks 33. The blocks 33 are arranged vertically. Third row decoders 32 are respectively provided above and below each block 33. A second row decoder 31 is provided at the center portion of the memory bank.

Output terminals of the third row decoders are connected to center portions of sub-word lines SWL. Unlike the fifth embodiment, the sub-word lines SWL are formed in the same metal wiring layer as the main word line MWL, e.g., in the first metal wiring layer. The sub-word lines SWL are provided in parallel with, for example, wirings 35, made by, for example, the polysilicon, as gates of transfer transistors of memory cells. The sub-word lines SWL are connected with the wirings 35 at connection areas 34.

In the present embodiment, it is possible to obtain the same advantages as those of the fifth embodiment. Further, since the sub-word lines SWL are formed in a metal wiring layer having a lower resistance than the gate wiring layer, the driving delay time of the sub-word lines can be shortened. For example, the driving delay time of the sub-word lines of the present embodiment is substantially a half of the driving delay time of the sub-word lines of the fifth embodiment. Therefore, the high-speed operation is enabled.

The present invention is not limited to a general-purpose DRAM but is applicable to any DRAM which has a bank function, such as a synchronous DRAM, a Rambus DRAM, a syncLink DRAM, or the like, and further to any semiconductor memory which adopts a shared sense amplifier system.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device comprising:
   a plurality of memory banks disposed in a first direction each memory bank having a plurality of memory cell arrays and a plurality of sense amplifiers, wherein said plurality of memory cell arrays and said plurality of sense amplifiers are alternately disposed in a second direction perpendicular to the first direction;
   a plurality of row decoder sections, each row decoder section having a plurality of row decoders disposed in the second direction, wherein said plurality of row decoder sections and said plurality of memory banks are disposed in the first direction;
   a column decoder section provided adjacent to said plurality of memory banks and said plurality of row decoder sections, said column decoder section having a plurality of column decoders disposed in the first direction;
   a plurality of first data lines laid in the first direction, respectively provided for said plurality of memory banks, and connected with said plurality of sense amplifiers in accordance with a signal outputted from said column decoder section;
   a plurality of second data lines laid in the first direction, penetrating through said plurality of memory banks, and shared by said plurality of first data lines; and
   a plurality of switching elements, each switching element having a first end connected to one of said plurality of first data lines and a second end connected to one of said plurality of second data lines, wherein said plurality of switching elements are controlled by a bank activation signal for at least one of said plurality of memory banks corresponding to at least one of said plurality of first data lines.

2. A semiconductor memory device according to claim 1, wherein said plurality of first data lines are formed in a different metal wiring layer from said plurality of second data lines.

3. A semiconductor memory device according to claim 2, wherein
   said plurality of first data lines and output lines of said plurality of row decoders are formed of a first metal wiring layer,
   an output line of said column decoders is formed of a second metal wiring layer, and
   said plurality of second data lines are formed of a third metal wiring layer.

4. A semiconductor memory device according to claim 1, wherein each of said plurality of switching elements includes a transistor having a first terminal connected to the first data lines, a second terminal connected to the second data lines, and a gate supplied with the bank activation signal.

5. A semiconductor memory device according to claim 1, wherein said plurality of switching elements function to amplify and transfer a signal on said plurality of first data lines to said plurality of second data lines.

6. A semiconductor memory device according to claim 5, wherein each of said plurality of switching elements has a differential amplifier of a current mirror type.

7. A semiconductor memory device comprising:
   a plurality of memory banks disposed in a first direction, each memory bank having a plurality of memory cell arrays and a plurality of sense amplifiers, wherein said plurality of memory cell arrays and said plurality of sense amplifiers are alternately disposed in a second direction perpendicular to the first direction;
   a plurality of row decoder sections, each row decoder section having a plurality of row decoders disposed in the second direction, wherein said plurality of row decoder sections and said plurality of memory banks are disposed in the first direction;
   a column decoder section adjacent to said plurality of memory banks and said plurality of row decoder sections, said column decoder section having a plurality of column decoders disposed in the first direction;
   a plurality of second data lines respectively provided for said plurality of memory banks and laid in the second direction;
   a plurality of third data lines laid in the first direction, penetrating through said plurality of memory banks; and
   a plurality of first switching elements, each first switching element having a first end connected to one of said plurality of second data lines and a second end connected to said plurality of third data lines, and controlled by a bank activation signal of a memory bank corresponding to one of said plurality of second data lines connected to said first end, to function to amplify and transfer a signal on said plurality of second data lines to said plurality of third data lines, wherein
   each of the plurality of memory banks includes
      a plurality of first data lines laid in the first direction and connected to the sense amplifiers, and
      a plurality of second switching elements, each second switching element having a first end connected to one of said plurality of first data lines and a second end connected to one of said plurality of second data lines, and controlled by a cell array activation signal from a memory cell array corresponding to a first data line connected to said first end of one of said plurality of second switching elements.

8. A semiconductor memory device according to claim 7, wherein
said plurality of first data lines are formed of a first metal wiring layer,
said plurality of second data lines are formed of a second metal wiring layer, and
said plurality of third data lines are formed of a third metal wiring layer.

9. A semiconductor memory device according to claim 7, wherein each of said plurality of second switching elements includes a transistor having a first terminal connected to one of said plurality of first data lines, a second terminal connected to one of said plurality of second data lines, and a gate supplied with a memory cell array activation signal.

10. A semiconductor memory device according to claim 7, wherein each of said plurality of first switching elements has a differential amplifier of a current mirror type.

11. A semiconductor memory device comprising:
a plurality of memory banks having a hierarchical word line system including main word lines and sub-word lines, and disposed in a first direction perpendicular to a second direction;
a second row decoder section having a plurality of second row decoders respectively provided for said plurality of memory banks, laid in the second direction, and each having output terminals connected to said main word line;
a column decoder section having a plurality of column decoders laid in the first direction;
first data lines laid in the first direction, respectively provided for said plurality of memory banks, and connected to a plurality of sense amplifiers;
second data lines laid in the first direction and penetrating through said plurality of memory banks; and
switching elements, each switching element having a first end connected to one of said first data lines and a second end connected to one of said second data lines, and controlled by a bank activation signal of a memory bank corresponding to one of said second data lines connected to said first end, wherein
each of said plurality of memory banks has a plurality of memory blocks disposed in the first direction,
each of said plurality of memory blocks has a plurality of memory cell arrays and said plurality of sense amplifiers such that the memory cell arrays and said plurality of sense amplifiers are alternately disposed in the second direction,
each of said plurality of memory cell arrays has a plurality of memory cells,
said plurality of memory cells are respectively connected to the sub-word lines, and
said plurality of memory cell blocks respectively include third row decoders having first ends connected to the main word lines and second ends connected to the sub-word lines, to selectively connect the main word lines to the sub-word lines corresponding to an address signal.

12. A semiconductor memory device according to claim 11, wherein said main word lines are formed of a first metal wiring layer, and said sub-word lines are formed of a gate wiring layer.

13. A semiconductor memory device according to claim 11, further comprising a first row decoder for outputting a control signal for controlling the second row decoders.

14. A semiconductor memory device according to claim 13, wherein a wiring supplied with the control signal outputted from said first row decoder is formed of a third metal wiring layer.

15. A semiconductor memory device according to claim 13, wherein said second row decoders are latch circuits controlled by the control signal outputted from said first row decoder.

16. A semiconductor memory device according to claim 11, wherein said sub-word lines are formed of third word lines consisting of a first metal wiring layer and a gate wiring layer, and are connected with said main word lines in connection areas in the memory cell arrays.

17. A semiconductor memory device according to claim 16, wherein the connection areas are provided at center portions of the third word lines.

18. A semiconductor memory device comprising:
a plurality of memory banks disposed in a first direction, each memory bank having a plurality of memory cell arrays and a plurality of sense amplifiers, wherein said plurality of memory cell arrays and said plurality of sense amplifiers are disposed in a second direction which is perpendicular to the first direction;
a plurality of row decoder sections, each row decoder section having a plurality of row decoders disposed in the second direction, wherein said plurality of row decoder sections and said plurality of memory banks are disposed in the first direction;
a column decoder section provided adjacent to said plurality of memory banks and said plurality of row decoder sections, said column decoder section having a plurality of column decoders disposed in the first direction;
a plurality of first data lines respectively provided for said plurality of memory banks, laid in the first direction, and connected with said plurality of sense amplifiers in accordance with a signal outputted from said column decoder section;
a plurality of second data lines laid in the first direction, penetrating through said plutality of memory banks, and shared by said plurality of first data lines; and
a plurality of switching elements, each switching element having a first end connected to one of said plurality of first data lines and a second end connected to one of said plurality of second data lines, wherein said plurality of switching elements are controlled by a bank activation signal for at least one of said plurality of memory banks corresponding to at least one of said plurality of first data lines.

19. The semiconductor memory device according to claim 18, wherein said plurality of first data lines are formed in a different metal wiring layer from said pluraliry of second data lines.

20. The semiconductor memory device according to claim 19, wherein said plurality of first data lines and output lines of said plurality of row decoders are formed of a first metal wiring layer,
an output line of a column decoder is formed of a second metal wiring layer, and
said plurality of second data lines are formed of a third metal wiring layer.

21. The semiconductor memory device according to claim 18, wherein each of said plurality of switching elements includes a transistor having a first end of a current path connected to the first data lines, a second end of the current path connected to the second data lines, and a gate supplied with the bank activation signal.

22. The semiconductor memory device according to claim 18, wherein said plurality of switching elements function to amplify and transfer a signal on said plurality of first data lines to said plurality of second data lines.

23. The semiconductor memory device according to claim 22, wherein each of said plurality of switching elements has a differential amplifier of a current mirror type.

24. A semiconductor memory device comprising;
a plurality of memory banks which are disposed in a first direction, each memory bank having a plurality of memory cell arrays and a plurality of sense amplifiers, wherein said plurality of memory cell arrays and said plurality of sense amplifiers are disposed in a second direction which is perpendicular to the first direction;
a plurality of row decoder sections, each row decoder section having a plurality of row decoders disposed in the second direction, wherein said plurality of row decoder sections and said plurality of memory banks are disposed in the first direction;
a plurality of second data lines respectively provided for said plurality of memory banks and laid in the second direction;
a plurality of third data lines laid in thd first direction, penetrating through said plurality of memory banks; and
a plurality of first switching elements, each first switching element having a first end connected to one of said plurality of second data lines and a second end connected to said plurality of third data lines, and controlled by a bank activation signal of a memory bank corresponding to one of said plurality of second data lines connected to the first end, to function to amplify and transfer a signal on said plurality of second data lines to said plurality of third data lines, wherein
each of the plurality of memory banks includes
a plurality of first data lines laid in the first direction and connected to the sense amplifiers, and
a plurality of second switching elements, each second switching element having a first end connected to one of said plurality of first data lines and a second end connected to one of said plurality of second data lines, and controlled by a memory cell array activation signal from a memory cell array corresponding to a first data line connected to the first end of one of said plurality of second switching elements.

25. The semiconductor memory device according to claim 24, wherein
said plurality of first data lines are formed of a first metal wiring layer,
said plurality of second data lines are formed of a second metal wiring layer, and
said plurality of third data lines are formed of a third metal wiring layer.

26. The semiconductor memory device according to claim 24, wherein each of said plurality of second switching elements includes a transistor having a first terminal connected to one of said plurality of first data lines, a second terminal connected to one of said plurality of second data lines, and a gate supplied with the memory cell array activation signal.

27. The semiconductor memory device according to claim 24, wherein each of said plurality of first switching elements has a differential amplifier of a current mirror type.

28. A semiconductor memory device comprising:
a plurality of memory banks having a hierarchical word line system including main word lines and sub-word lines, and disposed in a first direction perpendicular to a second direction;
a first row decoder section having a plurality of first row decoders respectively provided for said plurality of memory banks, laid in the second direction, and each having output terminals connected to said main word line;
first data lines respectively provided for said plurality of memory banks, laid in the first direction and connected to a plurality of sense amplifiers;
second data lines provided in the first direction penetrating through said plurality of memory banks; and
switching elements each having a first end connected to one of said first data lines and a second end connected to one of said second data lines, and controlled by a bank activation signal of a memory bank corresponding to one of said second data lines connected to the first end, wherein
each of said plurality of memory banks has a plurality of memory blocks disposed in the first direction,
each of said plurality of memory blocks has a plurality of memory cell arrays and said plurality of sense amplifiers, the memory cell arrays and said plurality of sense amplifiers being disposed in the second direction,
each of said plurality of memory cell arrays has a plurality of memory cells,
said plurality of memory cells in each of said plurality of memory cell arrays being respectively connected to the sub-word lines, and
said plurality of memory cell blocks respectively include second row decoders having first ends connected to main word lines and second ends connected to the sub-word lines, to selectively connect the main word lines to the sub-word lines corresponding to an address signal.

29. The semiconductor memory device according to claim 28, wherein said main word lines are formed of a first metal wiring layer, and said sub-word lines are formed of a gate wiring layer.

30. The semiconductor memory device according to claim 28, further comprising a third row decoder for outputting a control signal for controlling the first row decoders.

31. The semiconductor memory device according to claim 30, wherein a wiring supplied with the control signal outputted from said third row decoder is formed of a third metal wiring layer.

32. The semiconductor memory device according to claim 30, wherein said first row decoders are latch circuits controlled by the control signal outputted from said third row decoder.

33. The semiconductor memory device according to claim 28, wherein said sub-word lines are formed of word lines consisting of a first metal wiring layer and a gate wiring layer, and connected with said main word lines in connection areas in the memory cell arrays.

34. The semiconductor memory device according to claim 33, wherein the connection areas are provided at center portions of said word lines.

* * * * *

UNITED STATES PATENT AND TRADEMARK OFFICE
CERTIFICATE OF CORRECTION

PATENT NO. : 6,097,660
DATED : August 1, 2000
INVENTOR(S) : Kenji TSUCHIDA, et al.

It is certified that error appears in the above-identified patent and that said Letters Patent is hereby corrected as shown below:

— Claim 1, column 15, line 32:
--,-- has been added after the word "direction".

Signed and Sealed this

First Day of May, 2001

Attest:

NICHOLAS P. GODICI

Attesting Officer     Acting Director of the United States Patent and Trademark Office